United States Patent
Park et al.

(10) Patent No.: US 10,151,804 B2
(45) Date of Patent: Dec. 11, 2018

(54) POWER MONITORING SYSTEM

(71) Applicant: LSIS CO., LTD., Gyeonggi-do (KR)

(72) Inventors: Hun Park, Gyeonggi-do (KR);
Young-Gyu Yu, Gyeonggi-do (KR);
Hae-Tae Roh, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 180 days.

(21) Appl. No.: 15/233,524

(22) Filed: Aug. 10, 2016

(65) Prior Publication Data

US 2017/0052231 A1 Feb. 23, 2017

(30) Foreign Application Priority Data

Aug. 19, 2015 (KR) .................... 10-2015-0117001
Aug. 24, 2015 (KR) .................... 10-2015-0119143

(51) Int. Cl.
*G01R 31/40* (2014.01)
*H02J 13/00* (2006.01)
*G01D 4/00* (2006.01)

(52) U.S. Cl.
CPC ............ *G01R 31/40* (2013.01); *G01D 4/004* (2013.01); *H02J 13/0013* (2013.01);
(Continued)

(58) Field of Classification Search
CPC ...................................................... G01R 31/40
See application file for complete search history.

(56) References Cited

U.S. PATENT DOCUMENTS

2004/0016264 A1    1/2004   Lee
2008/0167756 A1    7/2008   Golden et al.
(Continued)

FOREIGN PATENT DOCUMENTS

JP    2011-83085 A    4/2011
JP    2013-183613 A   9/2013
(Continued)

OTHER PUBLICATIONS

Japanese Decision of refusal dated Aug. 1, 2017 in connection with the counterpart Japanese Patent Application.
(Continued)

*Primary Examiner* — Manuel L Barbee
(74) *Attorney, Agent, or Firm* — K&L Gates LLP

(57) ABSTRACT

Disclosed embodiments relate to a power monitoring system. In some embodiments, the power monitoring system includes: a sampling device configured to measure patterns of how loads included in the power system consume energy; an electric meter configured to measure a first amount of energy supplied from a transmission system to the power system; a power supply configured to supply power stored therein or generate power to supply it to the power system, and measure a second amount of energy supplied to the power system; an external server configured to receive measurements of the patterns from the sampling device, and obtain a third amount of energy consumed by the loads based on the measurements; and a home server configured to receive the first amount of energy and/or second amount of energy and transmit/receive data to/from the external server.

11 Claims, 5 Drawing Sheets

(52) U.S. Cl.
CPC ........... *Y02B 70/346* (2013.01); *Y02B 90/242* (2013.01); *Y02B 90/245* (2013.01); *Y02B 90/248* (2013.01); *Y02E 60/7807* (2013.01); *Y04S 20/322* (2013.01); *Y04S 20/38* (2013.01); *Y04S 20/40* (2013.01); *Y04S 20/52* (2013.01); *Y04S 20/525* (2013.01); *Y04S 40/12* (2013.01)

(56) References Cited

U.S. PATENT DOCUMENTS

| | | | |
|---|---|---|---|
| 2009/0112758 A1* | 4/2009 | Herzig | G01D 4/004 705/40 |
| 2011/0251807 A1* | 10/2011 | Rada | G01D 4/00 702/61 |
| 2012/0031055 A1 | 2/2012 | Weder | |
| 2012/0053739 A1 | 3/2012 | Brian et al. | |

FOREIGN PATENT DOCUMENTS

| | | |
|---|---|---|
| JP | 2013-210288 A | 10/2013 |
| JP | 5325604 B2 | 10/2013 |
| JP | 2014-39352 A | 2/2014 |
| JP | 2014-176161 A | 9/2014 |
| KR | 10-1077748 B1 | 10/2011 |
| WO | 2014184957 A1 | 11/2014 |
| WO | 2015028944 A1 | 3/2015 |
| WO | 2015/083397 A1 | 6/2015 |

OTHER PUBLICATIONS

Office Action dated Apr. 4, 2017 issued in corresponding Japanese Application No. 2016-160315.
European search report dated Jan. 17, 2017 for counterpart EP application 16176417.0.

* cited by examiner

PRIOR ART

POWER MONITORING SYSTEM

CROSS REFERENCE TO RELATED APPLICATIONS

This application claims the benefit of Korean Patent Application No. 10-2015-0117001, filed on Aug. 19, 2015 and entitled "POWER MONITORING SYSTEM" and Korean Patent Application No. 10-2015-0119143, filed on Aug. 24, 2015, entitled "POWER MONITORING SYSTEM", each of which is hereby incorporated by reference in its entirety.

BACKGROUND

Technical Field

The present disclosure relates to a power monitoring system. More specifically, the present disclosure relates to a power monitoring system that monitors electric energy for each of loads and to aggregate results of the monitoring to thereby monitor electric energy of the entire system.

Description of the Related Art

Typically, power being consumed in a residence can be monitored using an electric meter. Such an electric meter, however, can measure only the total amount of electric energy consumed in a residence but not the amount of electric energy consumed by each of appliances in the residence. Accordingly, a user cannot know the amount of energy consumed by each of the appliances and thus does not know which one of the appliances is to be managed in order to save energy consumption. It would be cost-inefficient to provide every appliance with an electric meter in order to measure the amount of energy consumed by the appliances.

To this end, non-intrusive load monitoring (NILM) technique has been developed to monitor the amount of energy consumed by every appliance in a residence. The NILM is a technique that predicts the amount of energy consumed by each of loads (appliances) in a building and a driving schedule for generating electric power by way of measuring overall voltage and current supply.

Specifically, the NILM may be carried out by using a sampling device. The sampling device can analyze patterns of how the loads consume energy while monitoring energy consumption. Specifically, the sampling device monitors contains information on energy consumption patterns each matched with one of the loads, and if a particular pattern is monitored, it is determined that an appliance matched with the pattern is consuming electric energy.

Although the amount of energy consumed by each of the loads can be measured by the sampling device, there is another problem in that it is not possible to measure the amount of energy consumption taking into account energy supplied from an external source, e.g., in a residence with a solar power generator or in a residence or a building with an energy management system. Such a common problem of NILM will be described in detail below with reference to FIG. 1.

FIG. 1 shows a typical power monitoring system including a sampling device for NILM;

As shown in FIG. 1, the power monitoring system includes a distribution board 2 that distributes power transmitted from an electric power system 1 to loads (electronic devices) 3. The distribution board may include a plurality of switches and a circuit breaker.

The power monitoring system includes a sampling device 10 in the distribution board. Specifically, the sampling device 10 may be disposed at a previous stage to the loads 3 and receive power before it is distributed. Accordingly, the sampling device may monitor the total amount of energy supplied to the loads 3 and may measure energy pattern for each of the loads 3. Examples of the loads 3 may be home appliances.

As described above, however, the sampling device is usually disposed inside the distribution board, and thus the sampling device cannot monitor the amount of electric energy supplied from an external source.

Employing an additional sampling device for monitoring the amount of electric energy supplied from an external source would be cost-inefficient. Under the circumstances, according to an embodiment of the present disclosure, a power monitoring system can accurately monitor the amount of energy supplied/consumed in the overall system by combining an existing monitoring device and a single sampling device, with no additional sampling device.

SUMMARY

It is an aspect of some embodiments of the present disclosure to provide a power monitoring system that accurately monitors the amount of energy supplied/consumed in the overall system with no additional sampling device.

It is another aspect of some embodiments of the present disclosure to provide a power monitoring system that saves cost for establishing the overall system by using communications technology among the monitoring devices.

In accordance with one aspect of some embodiments of the present disclosure, a power monitoring system includes: a sampling device configured to measure patterns of how loads included in the power system consume energy; an electric meter configured to measure a second amount of energy supplied from a transmission system to the power system; a power supply configured to supply power stored therein or generate power to supply it to the power system, and measure a third amount of energy supplied to the power system; an external server configured to receive measurements of the patterns from the sampling device, and obtain a first amount of energy consumed by the loads based on the measurements; and a home server configured to receive the second amount of energy and/or third amount of energy and transmit/receive data to/from the external server. The home server receive the first amount of energy from the external server, and calculates at least one of the first amount of energy, the second amount of energy and the third amount of energy.

In accordance with another aspect of some embodiments of the present disclosure, a power monitoring system includes: a sampling device configured to measure patterns of how loads included in the power system consume energy; an electric meter configured to measure a second amount of energy supplied from a transmission system to the power system; a power supply configured to supply power stored therein or generate power to supply it to the power system and measure a third amount of energy supplied to the power system; a first external server configured to receive the patterns from the sampling device, analyze the received patterns to obtain a first amount of energy consumed by the loads, and accumulate the obtain first amount of energy to store statistical data; a home server configured to receive the second amount of energy and/or third amount of energy and transmit the received second amount of energy and the third amount of energy to a second external server; and the second external server configured to receive the first amount of energy from the first external server and receive the second amount of energy and/or the third amount of energy from the home server. The second external server calculates at least one of the first, second and third amounts of energy.

DETAILED DESCRIPTION

Figure 1:
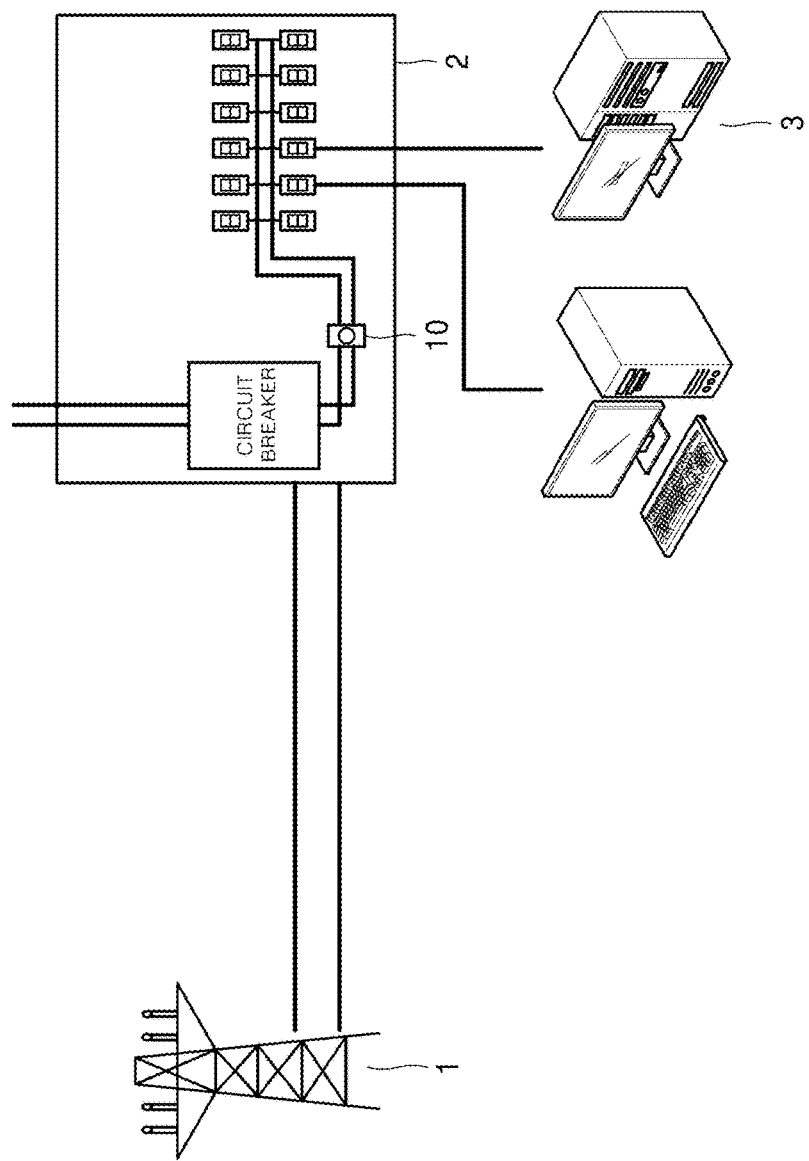
FIG. 1 shows a typical power monitoring system including a sampling device for NILM, according to the prior art.

In the following detailed description, reference is made to the accompanying drawings that show, by way of illustration, specific embodiments in which the claimed subject matter may be practiced. These embodiments are described in sufficient detail to enable those skilled in the art to practice the subject matter. However, embodiments of the present disclosure may be modified in various different ways and are not limited to some embodiments disclosed herein. In the accompanying drawings, well-known elements have been omitted in order not to unnecessarily obscure the gist of the present disclosure. Like reference numerals designate like elements throughout the disclosure.

It is to be noticed that the term "comprising", used in the present description and claims, should not be interpreted as being restricted to the means listed thereafter; it does not exclude other elements or steps.

Figure 2:
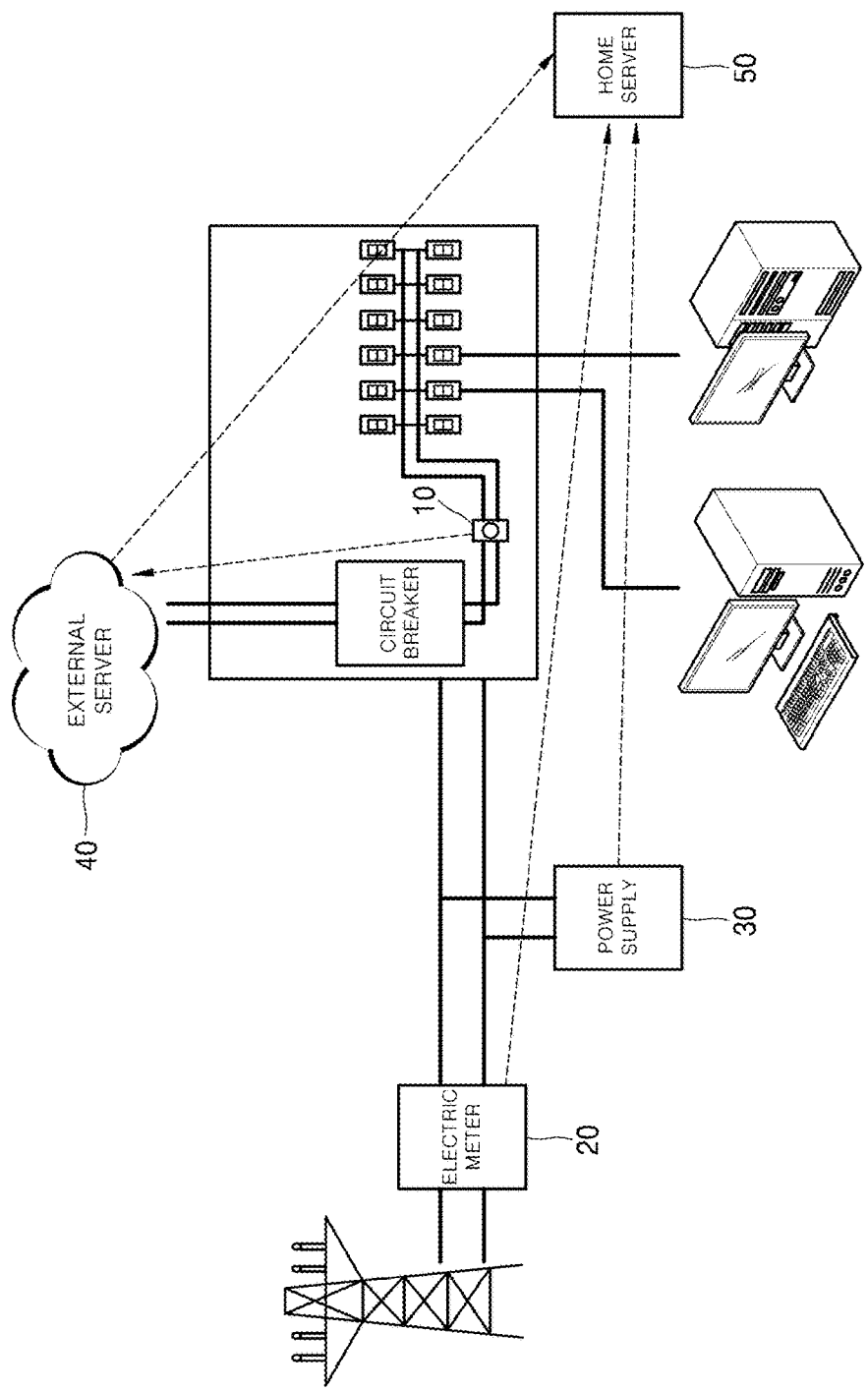
FIG. 2 is a block diagram of a power monitoring system according to a first embodiment of the present disclosure.

FIG. 2 is a block diagram of a power monitoring system according to a first embodiment of the present disclosure.

As shown in FIG. 2, the power monitoring system according to the first embodiment of the present disclosure may include a sampling device 10, an electric meter 20, a power supply 30, an external server 40 and a home server 50.

The sampling device 10 analyzes the energy consumed by loads in the power system, as described above. Specifically, the sampling device 10 may measure power consumption patterns of the loads.

The electric meter 20 may be a typical watt-hour meter. The electric meter 20 may measure the total amount of energy input/output to/from the power system. Specifically, the electric meter 20 may measure the total amount of energy by aggregating the energy consumed by the power system and the energy supplied to the power system.

The power supply 30 may supply power to the power system. For example, the power supply 30 may be a power generator. For another example, the power supply 30 may be an energy management system (EMS). The EMS may store power during off-peak hours and use the stored power during peak hours. In the case where the entire power monitoring system includes the power supply 30, the sampling device 10 can measure only the amount of energy consumed by each of the appliances but not the amount of energy supplied from the transmission system and the amount of energy supplied from the power supply 30 to the power system or the distribution board.

The external server 40 receives measurements from the sampling device 10. The external server 40 may receive the measurements on energy consumed by the loads from the sampling device 10, to obtain the amount of energy consumed by each of the loads. The external server 40 may transmit the obtained amount of energy consumed by each of the loads to the home server 50.

The home server 50 acquires the amount of energy measured by the electric meter 20 and the energy amount data measured by the power supply 30. In addition, the home server 50 may transmit/receive data regarding the measured amount of energy to/from the external server 40. The electric meter 20 and the power supply 30 may transmit the measured energy amount data using wired/wireless communications. The home server 50 may display the obtained energy amount data to allow users to see it.

According to the first embodiment of the present disclosure, the external server 40 receives the amounts of energy consumed by the loads acquired via the sampling device 10. The external server 40 may receive the measurements on energy consumption pattern from the sampling device 10 and may analyze the measurements to calculate the amount of energy consumed by each of the loads.

Then, the external server 40 transmits the energy amount data associated with the loads to the home server 50. The home server 50 acquires the measured amount of energy from the electric meter 20. Then, the home server 50 calculates the amount of consumed energy received from the external server 40 based on the total amount of energy supplied from the transmission system as received from the electric meter 20, to obtain the amount of the energy supplied from the power supply 30.

Specifically, according to the first embodiment of the present disclosure, the home server 50 subtracts the amount of consumed energy received from the external server 40 from the total amount of energy received from the electric meter 20, to obtain the amount of the energy supplied from the power supply 30 to the power system. In this manner, the home server 50 can obtain the amount of supplied energy even without receiving the amount of supplied energy from the power supply 30. In addition, the home server 50 may provide the received data and the calculated data values to users by displaying them.

According to a variant of the first embodiment of the present disclosure, the home server 50 receives the amount of energy supplied to the power system as measured by the power supply 30. In addition, the home server 50 receives the amounts of energy consumed by the loads as measured by the sampling device 10 via the external server 40. The external server 40 may receive the measurements from the sampling device 10 and may analyze the measurements to calculate the amount of consumed energy.

Then, the home server 50 calculates the amount of consumed energy received from the external server 40 based on the amount of supplied energy received from the power supply 30, to obtain the total amount of the energy supplied from the transmission system to the power system. Specifically, according to the first embodiment, the home external server 50 may subtract the amount of consumed energy received from the server 40 from the amount of supplied energy received from the power supply 30, to obtain the total amount of the energy supplied from the transmission system to the power system.

Specifically, if the obtained total amount of energy is a positive value, it may mean that the amount of energy supplied from the power supply 30 is larger than the amount of energy consumed by the loads. If the obtained total amount of energy is a negative value, on the other hand, it may mean that the amount of energy supplied from the power supply 30 is smaller than the amount of energy consumed by the loads. In this manner, the home server 50 can obtain the total amount of supplied energy even without receiving the total amount of energy supplied from the transmission system from the electric meter 20.

According to a variant of the first embodiment of the present disclosure, the home server 50 may receive all of the amounts of energy measured by the electric meter 20, the power supply 30, and the external server 40.

According to this variant of first embodiment of the present disclosure, when a failure occurs in one element of the power monitoring system, the home server 50 can obtain the amount of energy as measured by the element by calculating it.

Figure 3:
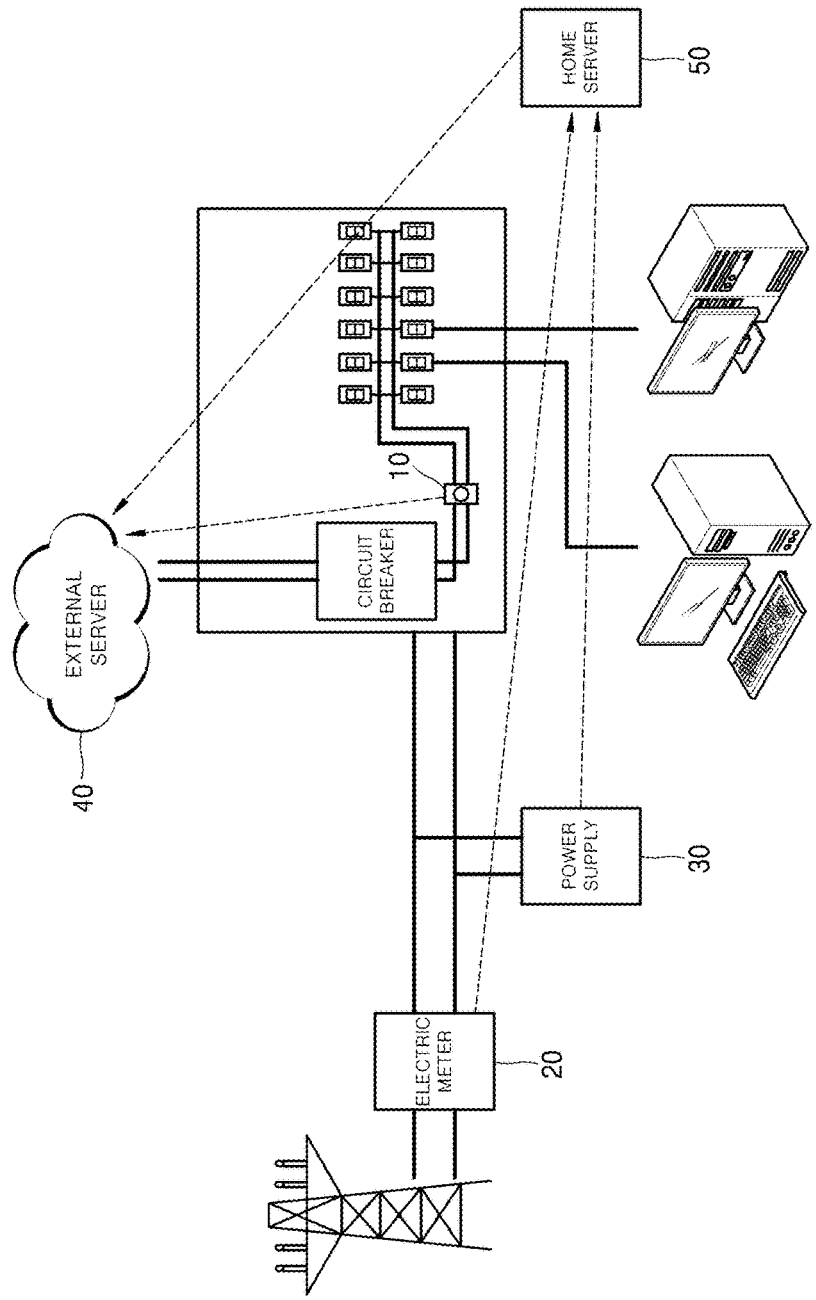
FIG. 3 is a block diagram of a power monitoring system according to a variant of the first embodiment of the present disclosure.

FIG. 3 is a block diagram of a power monitoring system according to a variant of the first embodiment of the present disclosure.

The configuration of the system shown in FIG. 3 is identical to that shown in FIG. 2; and, therefore, redundant description will be described.

Unlike the system according to the first embodiment shown in FIG. 2, in the system according to the variant of the first embodiment shown in FIG. 3, the external server 40 may aggregate all of the received amounts of energy to calculate them. Specifically, the external server 40 may receive the amount of energy measured by the electric meter 20 and the energy amount data measured by the power supply 30 via the home server 50. The external server 40 may obtain the amount of energy consumed by the loads based on the measurements received from the sampling device 10.

The home server 50 may convert the energy amount data received from the electric meter 20 and the power supply 30 to transmit them to the external server 40. Specifically, according to an embodiment of the present disclosure, the home server 50 may convert analog values received from the electric meter 20 and the power supply 30 into digital values, to transmit them to the external server 40. In this case, the external server 40 may aggregate the measured amounts of energy immediately with no additional converting procedure According to the first embodiment of the present disclosure, the external server 40 may receive the total amount of energy supplied from the transmission system via the home server 50 and may calculate the amount of energy consumed by the loads received from the sampling device 10, to obtain the amount of energy supplied from the power supply 30 to the power system.

According to a variant of the first embodiment of the present disclosure, the external server 40 may receive the amount of energy supplied from the power supply via the home server 50 and may calculate the amount of energy consumed by the loads acquired via the sampling device 10, to obtain the total amount of energy supplied from the transmission system.

The external server 40 may compare the obtained amount of energy with other power systems and may transmit the results of the comparison to the home server 50. Users may make a plan for energy consumption based on comparison data received from the external server 40.

Figure 4:
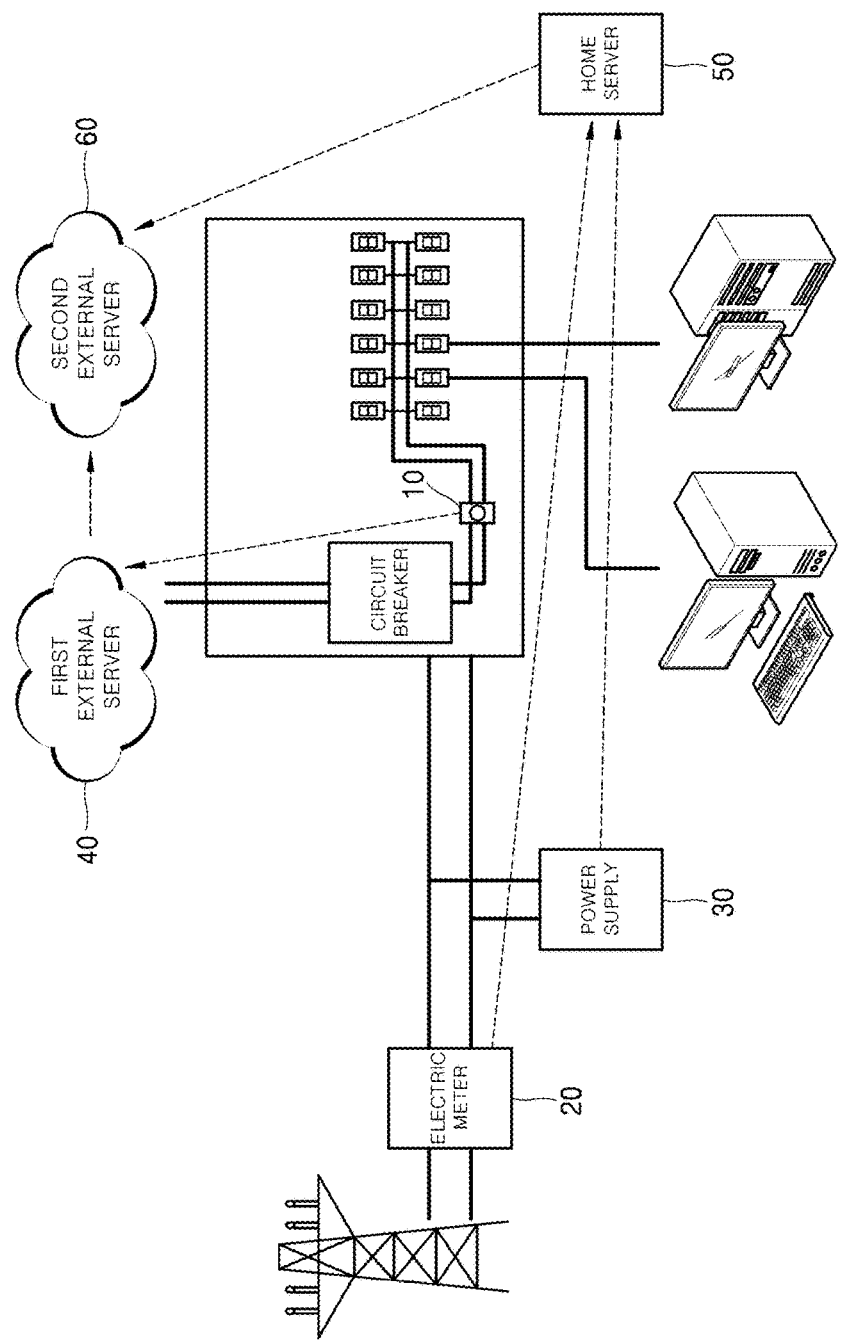
FIG. 4 is a block diagram of a power monitoring system according to the second embodiment of the present disclosure.

As shown in FIG. 4, the power monitoring system according to a second embodiment of the present disclosure may include a sampling device 10, an electric meter 20, a power supply 30, a first external server 40, a home server 50, and a second external server 60. The two external servers included the power monitoring system may be run by different entities. As the two external servers are run by different entities, the power monitoring system may include an advantage in terms of operation.

FIG. 4 is a block diagram of a power monitoring system according to the second embodiment of the present disclosure; and The configuration and functionality of the electric meter 20 and the power supply 30 of the power monitoring system according to the second embodiment are identical to those of the first embodiment; and, therefore, redundant description will be omitted.

The sampling device 10 analyzes the energy consumed by loads in the power system, as described above. Specifically, the sampling device 10 may analyze the energy consumed by the loads to calculate the amount of consumed energy.

The first external server 40 receives results of the analysis from the sampling device 10. The first external server 40 may receive the total amount of energy consumed by electronic devices from the sampling device 10 and may analyze it by using an NILM algorithm to obtain the amount of energy consumed by each of the loads. The first external server 40 may transmit the obtained amount of energy consumed by each of the loads to a second external server 50. Specifically, the first external server 40 may be an NILM company. The first external server 40 may accumulate the obtained amount of energy to store it as statistical data.

In addition, the first external server 40 may collect energy consumption data from a plurality of power system. The first external server 40 may use the collected statistical data to created big data. Consumers may access the first external server 40 to acquire the statistical data and may make a plan for energy consumption based on the acquired data. In addition, consumers may access the first external server 40 to establish a business plan based on the statistical data.

In other words, consumers or users may send a request for data to the first external server 40 for their own purposes. For example, a construction plan such as building a power plant may be established based on the data provided from the first external server 40.

The home server 50 acquires the amount of energy measured by the electric meter 20 and/or the energy amount data measured by the power supply 30. The electric meter 20 and the power supply 30 may transmit the measured energy amount data using wired/wireless communications. The home server 50 may transmit the obtained energy amount data to the second external server 60.

The second external server 60 may acquire the amount of energy measured by the electric meter 20 and the energy amount data measured by the power supply 30 from the home server 50.

The second external server 60 may be a consolidated server connected to a plurality of home servers 50.

According to an embodiment of the present disclosure, the second external server 60 may be an element of a power system including the home server 50. According to another embodiment of the present disclosure, the second external server 60 may be an element connected to a plurality of power systems.

In this case, the second external server 60 may manage and supervise energy use of the plurality of power systems. According to another embodiment of the present disclosure, the first external server and the second external server may be elements of a larger server.

According to the second embodiment of the present disclosure, the first external server 40 receives the amounts of energy consumed by all of the loads as measured by the sampling device 10. The first external server 40 may receive the measurements from the sampling device 10 and may analyze them to calculate the amount of energy consumed by each of appliances (or loads). The first external server 40 may transmit the energy amount data associated with the loads to the second external server 60. The second external server 50 acquires the measured amount of energy from the electric meter 20 via the home server 50. Then, the second external server 60 calculates the amount of consumed energy received from the first external server 40 based on the total amount of energy supplied from the power system as received from the electric meter 20, to obtain the amount of the energy supplied from the power supply 30.

Specifically, according to the second embodiment of the present disclosure, the second external server 60 subtracts the amount of consumed energy received from the first external server 40 from the total amount of energy received from the electric meter 20, to obtain the amount of the energy supplied from the power supply 30 to the power system. In this manner, the second external server 60 can obtain the amount of supplied energy even without receiving the amount of supplied energy from the power supply 30. In addition, the second external server 60 may provide the received data and the calculated data values to users.

According to a variant of the second embodiment of the present disclosure, the second external server 60 receives the amount of energy supplied to the power system as measured by the power supply 30 via the home server 50. In addition, the 60 receives the amount energy consumed by the loads as analyzed by the 10 via the first external server 40. In doing so, the first external server 40 may receive the measurement from the 10 and may analyze it to calculate the amount of energy consumed by each of the loads. Then, the second external server 60 calculates the amount of consumed energy received from the first external server 40 based on the amount of supplied energy received from the power supply 30, to obtain the amount of the energy supplied from the transmission system to the power system, e.g., the loads.

Specifically, according to the second embodiment, the second external server 60 may subtract the amount of consumed energy received from the first server 40 from the amount of supplied energy received from the power supply 30, to obtain the total amount of the energy supplied from the transmission system to the power system. Specifically, if the obtained total amount of energy is a positive value, it may mean that the amount of energy supplied from the power supply 30 is larger than the amount of energy consumed by the loads. If the obtained total amount of energy is a negative value, on the other hand, it may mean that the amount of energy supplied from the power supply 30 is smaller than the amount of energy consumed by the loads. In this manner, the second external server 60 can obtain the total amount of supplied energy even without receiving the total amount of supplied energy from the electric meter 20.

According to a variant of the second embodiment of the present disclosure, the second external server 60 may receive all of the amounts of energy measured by the electric meter 20, the power supply 30, and the first external server 40. Specifically, the second external server 60 may receive the amounts of energy measured by the electric meter 20 and the power supply 30 via the home server 50. The second external server 60 may receive data refined by the home server 50. For example, the second external server 60 may receive data from which noise includes been removed by the home server 50.

According to this embodiment of the present disclosure, when a failure occurs in one element of the power monitoring system, the second external server 60 can obtain the amount of energy as measured by the element by calculating it.

Figure 5:
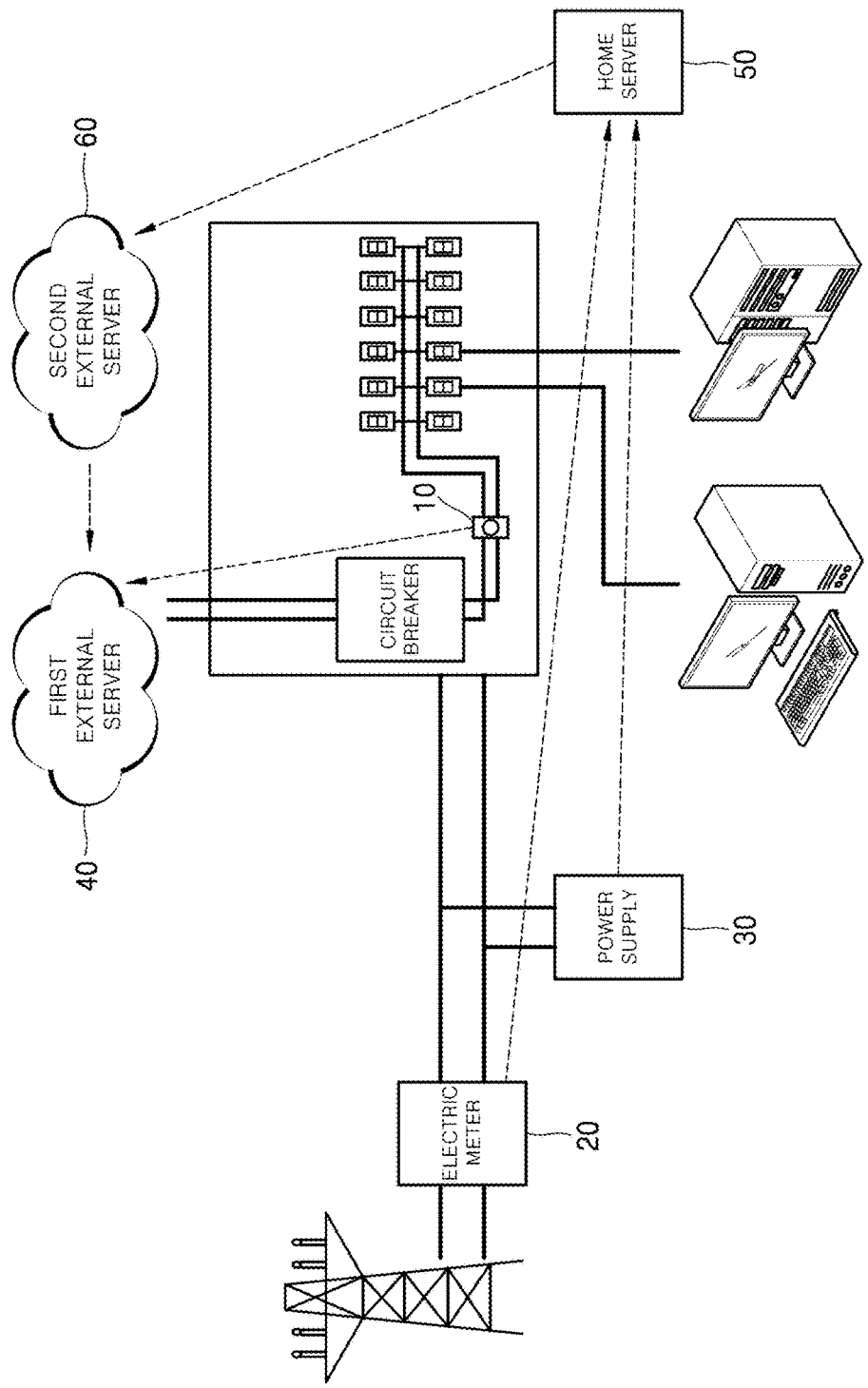
FIG. 5 is a block diagram of a power monitoring system according to a variant of the second embodiment of the present disclosure.

FIG. 5 is a block diagram of a power monitoring system according to a variant of the second embodiment of the present disclosure.

The configuration of the system shown in FIG. 5 is identical to that shown in FIG. 4; and, therefore, redundant description will be described.

Unlike the system according to the second embodiment shown in FIG. 4, the system according to the variant of the second embodiment shown in FIG. 5 may calculate. Specifically, the first external server 40 may receive the amount of energy measured by the electric meter 20 and the energy amount data measured by the power supply 30 via the second external server 60. Specifically, the home server 50 may receive energy amount data from the electric meter 20 and the power supply 30 and may transmit it to the second external server 60. The second external server 60 may transmit the data received from the home server 50 to the first external server 40. The first external server 40 may analyze the energy consumption patterns of the loads received from the sampling device 10, to obtain the amount of energy consumed by each of the loads.

The home server 50 may convert the energy amount data received from the electric meter 20 and the power supply 30 to transmit it to the first and second external servers 40 and 60. Specifically, according to an embodiment of the present disclosure, the home server 50 may convert analog values received from the electric meter 20 and the power supply 30 into digital values, to transmit them to the first and second external servers 40 and 60. In this case, the first and second external servers 40 and 60 may aggregate the measured amount of energy immediately with no additional converting procedure.

According to the second embodiment of the present disclosure, the first external server 40 may receive the total amount of energy supplied from the transmission system via the second transmission server 60 and may calculate the amount of energy consumed by the loads received from the sampling device 10, to obtain the amount of energy supplied from the power supply 30 to the power system.

According to a variant of the second embodiment of the present disclosure, the first external server 40 may receive the amount of energy supplied from the power supply 30 to the power system via the second external server 60, and may calculate the amount of energy consumed by the loads received from the sampling device 10, to obtain the total amount of energy supplied from the transmission system.

The first external server 40 may compare the obtained amount of energy with other power systems and may transmit the results of the comparison to the second external server 60. Users may make a plan for energy consumption based on comparison data received from the first external server 40 via the home server 50.

According to another variant of the second embodiment of the present disclosure, the first external server 40 and/or the second external server 60 may control energy consumption of the power system via the home server 50. Specifically, the home server 50 may include the ability of controlling the amount of energy consumption of the power system. The first external server 40 or the second external server 60, whichever performs calculation, may transmit an instruction to control the amount of energy consumption to the home server 50 based on the calculation results. The home server 50 may control the amount of energy consumption of the power system in response to the received control instruction. Specifically, according to the second embodiment of the present disclosure, the home server 50 may control the amount of energy supplied to the loads. According to a variant of the second embodiment of the present disclosure, the home server 50 may control the amount of energy supplied from the power supply 30. For example, in the case where the power supply 30 is an energy management system, the home server 50 may control the amount of charged/discharged energy. In conclusion, according to the second embodiment of the present disclosure, the first external server 40 or the second external server 60 connected to the plurality of home servers 50 may control energy consumption all together based on the monitored values. In other words, according to the second embodiment of the present disclosure, an external server that manages the entire large-scale industrial or residential complex can control energy consumption by aggregating energy consumption patterns of power systems.

As set forth above, according to first and second embodiments of the present disclosure, there is provided a power monitoring system that accurately monitors the amount of energy supplied/consumed in the overall system with no additional sampling device.

In addition, according to first and second embodiments of the present disclosure, there is provided a power monitoring system that saves cost for establishing the overall system by using communications technology among the monitoring devices.

References to "one embodiment" or "an embodiment" do not necessarily refer to the same embodiment, although they may. Further, a particular feature, structure, effect in some embodiments may be practiced in other embodiments by combining or modifying them by those skilled in the art. Accordingly, it is to be understood that such combinations and modifications also fall within the scope of the present disclosure.

Although the embodiments of the present disclosure have been disclosed for illustrative purposes, those skilled in the art would appreciate that various modifications and substitutions may be made without departing from the scope and spirit of the disclosure. For example, elements of the embodiment of the present disclosure may be modified. Such modifications and substitutions are also construed as falling within the scope of the present disclosure as defined by the appended claims. The accompanying claims and their equivalents are intended to cover such forms or modifications as would fall within the scope and spirit of the protection. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A power monitoring system comprising:
    a sampling device configured to measure consumption patterns of loads included in a power system that consumes energy;
    an electric meter configured to measure a first amount of energy supplied from a transmission system to the power system;
    a power supply configured to supply power to the power system, and measure a second amount of energy supplied to the power system, wherein the power supply is connected between the transmission system and the sampling device;
    an external server configured to receive the consumption patterns measured from the sampling device and obtain a third amount of energy consumed by each of the loads based on the consumption patterns; and
    a home server configured to receive at least one of the first amount of energy and the second amount of energy, and transmit and/or receive data to and/or from the external server,
    wherein the home server is further configured to:
        receive the third amount of energy from the external server; and
        calculate the second amount of energy based on the first amount of energy and the third amount of energy when the measured second amount of energy is not available.

2. The power monitoring system of claim 1, wherein the home server subtracts the first amount of energy from the third amount of energy to calculate the second amount of energy.

3. The power monitoring system of claim 1, wherein the home server subtracts the second amount of energy from the third amount of energy to obtain the first amount of energy when the measured first amount of energy is not available.

4. The power monitoring system of claim 1, wherein the home server is further configured to receive the first amount of energy and the second amount of energy, and convert the received first amount of energy and the second amount of energy in the form of an analog signal into a digital signal to transmit to the external server.

5. The power monitoring system of claim 4, wherein the external server calculates the third amount of energy based on the first amount of energy and the second amount of energy received from the home server when the consumption patterns measured from the sampling device is not received.

6. The power monitoring system of claim 1, wherein the power supply comprises an energy management system and/or a power generator.

7. A power monitoring system comprising:
    a sampling device configured to measure consumption patterns of loads included in a power system that consumes energy;
    an electric meter configured to measure a first amount of energy supplied from a transmission system to the power system;
    a power supply configured to supply power to the power system and measure a second amount of energy supplied to the power system, wherein the power supply is connected between the transmission system and the sampling device;
    a first external server configured to receive the consumption patterns measured from the sampling device, analyze the received consumption patterns to obtain a third amount of energy consumed by each of the loads and accumulate the obtained third amount of energy to store statistical data;
    a home server configured to receive the first amount of energy and/or second amount of energy and transmit the received first amount of energy and/or second amount of energy to a second external server; and the second external server configured to receive the third amount of energy from the first external server and receive the first amount of energy and/or the second amount of energy from the home server, wherein the second external server is further configured to:

calculate the second amount of energy based on the first amount of energy and the third amount of energy when the measured second amount of energy is not available; and transmit a control instruction to control energy consumption to the home server based on at least the received first amount of energy, the second amount of energy, and the third amount of energy, wherein the home server is further configured to control the energy consumption of the power system based on the received control instruction.

8. The power monitoring system of claim 7, wherein the second external server subtracts the first amount of energy from the third amount of energy to calculate the second amount of energy.

9. The power monitoring system of claim 7, wherein the second external server subtracts the second amount of energy from the third amount of energy to obtain the first amount of energy when the measured first amount of energy is not available.

10. The power monitoring system of claim 7, wherein the home server is further configured to receive the first amount of energy and/or the second amount of energy, and convert the received first amount of energy and/or the second amount of energy in the form of an analog signal into a digital signal to transmit it to the second external server.

11. The power monitoring system of claim 7, wherein the first external server is further configured to receive the first amount of energy and the second amount of energy from the second external server.

* * * * *